United States Patent [19]

Kosinski et al.

[11] Patent Number: 5,414,322
[45] Date of Patent: May 9, 1995

[54] CRYSTAL RESONATOR WITH MULTIPLE SEGMENTED LATERAL-FIELD EXCITATION ELECTRODES

[75] Inventors: John A. Kosinski, Wall Township, Monmouth County; Arthur Ballato, Oceanport; Yicheng Lu, Highland Park, all of N.J.

[73] Assignee: The United States of America as represented by the Secretary of the Army, Washington, D.C.

[21] Appl. No.: 229,498

[22] Filed: Apr. 19, 1994

[51] Int. Cl.$^6$ .............................. H01L 41/08
[52] U.S. Cl. ..................... 310/366; 310/318; 310/361
[58] Field of Search ............ 310/316, 317, 318, 360, 310/361, 365, 366

[56] References Cited

U.S. PATENT DOCUMENTS

| | | | |
|---|---|---|---|
| 1,907,427 | 5/1933 | Marrison | 310/366 X |
| 3,047,823 | 7/1962 | Ranky | 310/366 |
| 3,165,651 | 1/1965 | Bechmann | 310/365 |
| 4,039,969 | 8/1977 | Martin | 310/366 X |
| 4,044,317 | 8/1977 | Newell et al. | 310/366 X |
| 4,184,095 | 1/1980 | Stacchiotti et al. | 310/366 |
| 4,376,919 | 3/1983 | Konno et al. | 310/366 X |
| 4,625,138 | 11/1986 | Ballato | 310/365 X |
| 4,754,187 | 6/1988 | Kosinski | 310/361 |
| 5,041,754 | 8/1991 | Smythe | 310/366 |
| 5,132,643 | 7/1992 | Ueno et al. | 310/366 X |
| 5,153,476 | 10/1992 | Kosinski | 310/366 X |
| 5,233,259 | 8/1993 | Krishnaswamy et al. | 310/365 X |
| 5,274,297 | 12/1993 | Hermann et al. | 310/365 X |

Primary Examiner—Mark O. Budd
Attorney, Agent, or Firm—Michael Zelenka; William H. Anderson

[57] ABSTRACT

A crystal resonator including at least three, typically four linear electrode segments, formed on one of the major faces of piezoelectric resonator blank and providing at least two gaps which are selectively excited by RF voltages of predetermined magnitude and phase for generating a resultant lateral-field oriented at an arbitrary angle $\Psi$ with respect to the coordinate axes of the crystal plate for varying the lateral-field piezoelectric coupling k which is a parameter indicative of the degree to which an electrical energy is converted to mechanical energy in the resonator. By adjusting the magnitude and phases of the excitation voltages, applied to the electrode segments, the lateral-field direction becomes steerable so as to alter the electrical characteristics of the resonator including the lateral-field excitation anti-resonance frequency.

20 Claims, 2 Drawing Sheets

CRYSTAL RESONATOR WITH MULTIPLE SEGMENTED LATERAL-FIELD EXCITATION ELECTRODES

GOVERNMENT INTEREST

The invention described herein may be manufactured, used, and licensed by and for the government for governmental purposes without the payment to us of any royalty thereon.

FIELD OF THE INVENTION

This invention related generally to piezoelectric crystal resonators used in crystal oscillators and crystal filters and more particularly to lateral-field excitation piezoelectric crystal resonators.

BACKGROUND OF THE INVENTION

Lateral-field excitation resonators are generally known and conventionally comprise a piezoelectric crystal resonator plate having a single pair of electrode segments formed on a major surface of the resonator plate. The electrode segments are linearly aligned and are separated by a narrow gap across which is generated an electric driving field by the application of an excitation voltage applied to the electrode extremities at the peripheral edge of the resonator plate. The properties of the conventional lateral-field excitation resonator are determined by the direction and dimensions of the gap between the electrode segments and thus are fixed at values determined by the electrode geometry.

SUMMARY OF THE INVENTION

It is an object of the present invention therefore to provide a crystal resonator which is tunable using lateral-field excitation.

It is a further object of the invention to provide tunable poles of a crystal resonator along with selectable excitation of the acoustic modes.

It is another object of the invention to provide a crystal resonator which permits the lateral-field direction to be arbitrarily selected through appropriate connections to its external terminals, which in turn allows tunability of the resonator antiresonances, antiresonance frequency-temperature behavior and modal excitations.

Briefly, the foregoing and other objects of the invention are achieved by a crystal resonator including N electrode segments wherein $N \geq 3$, providing at least two gaps and suitably excited by RF voltages of predetermined magnitude and phase for generating a resultant lateral-field oriented at an arbitrary angle $\Psi$ with respect to the coordinate axes of the crystal plate for varying the lateral-field piezoelectric coupling k which is a parameter indicative of the degree to which a electrical energy is converted to mechanical energy in the resonator. By adjusting the magnitude and phases of the excitation voltages, the lateral-field direction becomes steerable so as to alter the electrical characteristics of the resonator such as strength of the modes, antiresonance frequency-temperature behavior, and the lateral-field excitation antiresonance frequency.

BRIEF DESCRIPTION OF THE DRAWINGS

These and other objects, features, and details of the invention will become apparent in light of the ensuing detailed disclosure, and particularly in light of the drawings wherein.

DETAILED DESCRIPTION OF THE INVENTION

Figure 1:
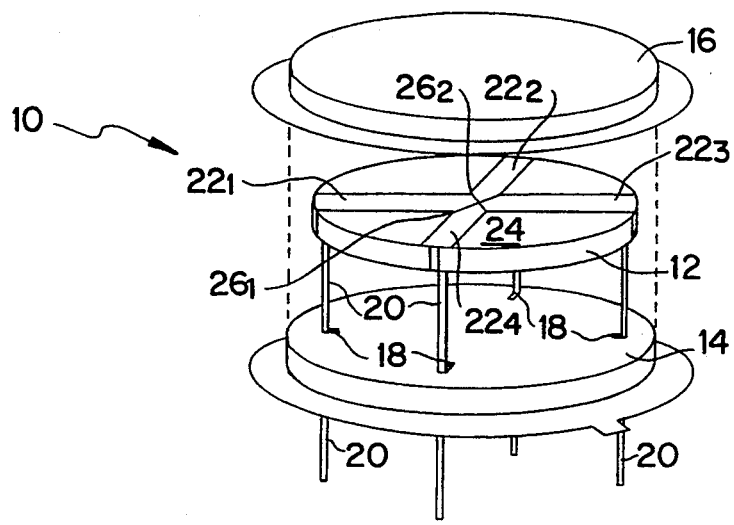
FIG. 1 is an exploded perspective view of a crystal resonator in accordance with a preferred embodiment of the invention.
Figure 2:
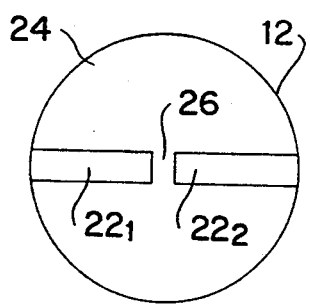
FIG. 2 is a top plan view generally illustrative of a typical prior art lateral-field excitation type resonator.

Referring now to the drawings wherein like reference numerals refer to like components throughout, reference numeral 10 denotes a crystal resonator assembly including a resonator plate 12 according to the subject invention which is in the form of a piezoelectric disc member mounted on a base 14 and which is enclosed by a lid 16 which structurally matches the base 14. While the resonator plate 12 is depicted as being a flat face disc member, it should be noted that, when desirable, other shapes may be resorted to such as a resonator plate having plano-convex, bi-convex, plano-concave, bi-concave faces. The base 14, moreover, includes a plurality of through holes 18 which permits the passage of a plurality of connector pins 20 to pass therethrough. The connector pins 20 are bonded to the resonator electrodes which are shown comprising four segments $22_1$, $22_2$, $22_3$, and $22_4$ and which are further shown in plan view in FIG. 3. Such an arrangement defines a multiply segmented lateral-field excitation (MuSLE) electrode structure which is formed on the top major surface 24 of the crystal resonator plate 12.

Figure 5:
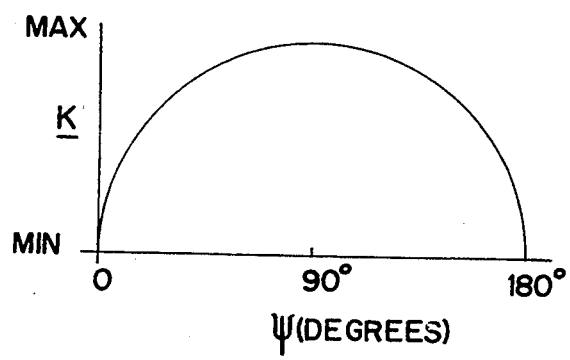
FIG. 5 is a characteristic curve illustrative of the relationship of piezoelectric coupling as a function of lateral-field angle for a crystal resonator in accordance with the subject invention.

In a conventional resonator electrode structure in accordance with the known prior art, the electrode structure normally takes the form of a single pair of electrode segments $22_1$ and $22_2$ which are formed on one of the major surfaces, such as the top surface 24. The electrode segments are separated by a relatively narrow gap across which is generated a driving electric field by an energizing potential, not shown, connected across the electrode segments $22_1$ and $22_2$. The properties of a conventional lateral-field excitation resonator are determined by the direction and dimensions of the gap 26 between the electrode segments $22_1$ and $22_2$. The strength of the modal excitation is determined by the lateral-field piezoelectric coupling k and is a function of the lateral-field angle $\Psi$ relative to the coordinate axes of the crystal plate. Such a characteristic curve is shown in FIG. 5.

Figure 3:
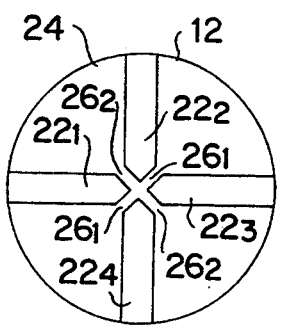
FIG. 3 is a top plan view illustrative of the electrode configuration of the crystal resonator shown in FIG. 1.
Figure 4:
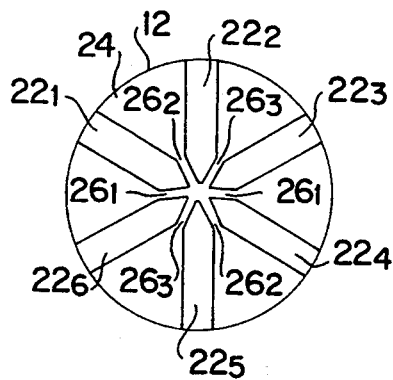
FIG. 4 is a top plan view generally illustrative of the electrode configuration of a second preferred embodiment of the invention.

In the subject invention, further segmentation of the driving electrode arrangement is contemplated by a multiply segmented lateral-field excitation (MuSLE) electrode arrangement which provides at least one additional gap as shown in FIGS. 3 and 4. The arrangement shown in FIG. 3 includes two gaps $26_1$ and $26_2$ formed between four mutually orthogonal electrode segments $22_1$, $22_2$, $22_3$, and $22_4$ while the configuration in FIG. 4 includes three gaps, $26_1$, $26_2$, and $26_3$ formed between three pairs of electrodes consisting of six electrode segments $22_1$, $22_2$ ... $22_5$, and $22_6$.

By adding the second gap $26_2$ as shown in FIG. 3, it becomes possible to add a second component to the driving electric field whereas the three gaps $26_1$, $26_2$, and $26_3$ shown in the embodiment of FIG. 4 permits a third component to be added to the driving electric field. While the MuSLE electrode segments of FIGS. 3 and 4 are shown on only one side of the resonator blank 12 it is possible to implement this type of electrode structure on both top and bottom of the blank 12.

In order to understand the principle of operation of the subject invention, one must examine the basics of lateral-field excitation in crystal resonators and to understand the advantages of the MuSLE electrode concept exemplified in the two embodiments of FIGS. 3 and 4, one must compare it to conventional thickness-field excitation.

For simple thickness modes in a piezoelectric plate resonator, the resonance and antiresonance frequencies are determined by the transcendental equations shown in Table I below:

TABLE I

| Excitation | Frequency | Relationship | |
|---|---|---|---|
| TE | resonance | $\tan X = \dfrac{X}{k^2 + \mu X^2}$, | $X = \dfrac{\pi}{2} \dfrac{f_{Ru}^{(M)}}{f_{Ao}^{(1)}}$ |
| TE | anti-resonance | $\tan X = \dfrac{1}{\mu X}$, | $X = \dfrac{\pi}{2} \dfrac{f_{Au}^{(M)}}{f_{Ao}^{(1)}}$ |
| LE | resonance | $\tan X = \dfrac{1}{\mu X}$, | $X = \dfrac{\pi}{2} \dfrac{f_{Au}^{(M)}}{f_{Ro}^{(1)}}$ |
| LE | anti-resonance | $\tan X = \dfrac{X}{-k^2 + \mu X^2}$, | $X = \dfrac{\pi}{2} \dfrac{f_{Au}^{(M)}}{f_{Ro}^{(1)}}$ |

In Table 1, TE stands for thickness-field excitation, LE stands for lateral-field excitation, X denotes the harmonic frequency ratio, $\mu$ is the mass loading due to the electrodes (a constant), $f_{Ru}^{(m)}$ is the Mth harmonic resonance frequency with mass loading, and $f_{Au}^{(m)}$ is the Mth harmonic antiresonance frequency with mass loading, k is the thickness-field piezoelectric coupling, and k is the lateral-field piezoelectric coupling.

Given the equation for calculating the frequency term, the denominator of the harmonic frequency ratio is the same for both thickness-field excitation and lateral-field excitation and corresponds to the zero mass loading and fundamental harmonic (M=1). It should be noted that the thickness piezoelectric coupling k is substantially a constant and independent of the thickness excitation electrode arrangement, whereas the lateral-field piezoelectric coupling k is a function of the lateral-field angle $\Psi$ relative to the coordinate axes of the crystal plate. By changing the lateral-field angle $\Psi$, one can change the coupling k which determines the level of excitation, the LE antiresonance frequency, and the LE antiresonance frequency-temperature behavior and its temperature derivatives.

As an example of how this is accomplished, reference is made to the resonator mode with the lateral-field coupling characteristic as shown in FIG. 4 where the coupling k=0 for a field angle $\Psi = 0°$ and a maximum value for a field angle $\Psi = 90°$.

Figure 6:
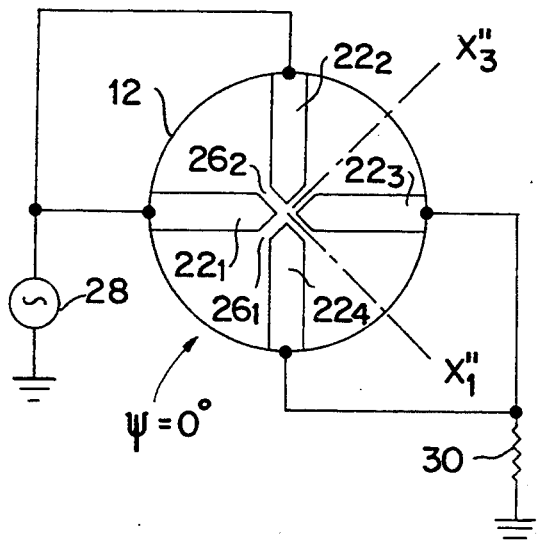
FIGS. 6, 7, and 8 are electrical schematic diagrams illustrative of circuitry for varying the lateral-field angle in order to obtain one of a plurality of tunable resonator acoustic modes.
Figure 7:
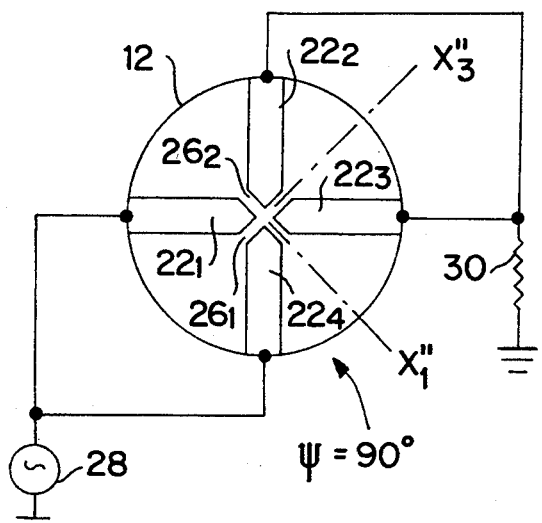
Figure 8:
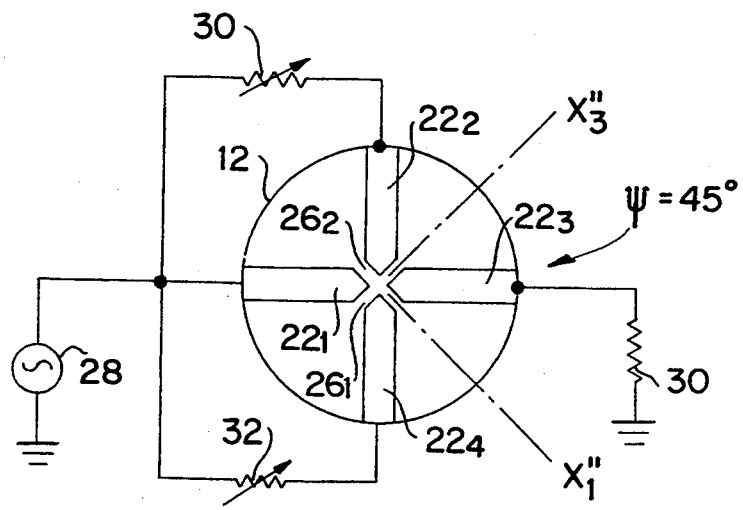

FIGS. 6, 7, and 8 depict the manner in which field angles of $\Psi = 0°$, $\Psi = 90°$, and $\Psi = 45°$ can be implemented using four electrode segments $22_1$, $22_2$, $22_3$, $22_4$ and two gaps $26_1$ and $26_2$ as shown in FIG. 3. With respect to FIGS. 6, 7, and 8, the rotated crystal field plate axes $x_1''$ and $x_3''$ are aligned along the gaps $26_1$ and $26_2$ of the electrodes $22_1$, $22_2$, $22_3$, and $22_4$.

Referring now to FIG. 6, the crystal plate 12 with four MuSLE electrode segments $22_1$, $22_2$, $22_3$, and $22_4$ have segments $22_1$ and $22_2$ acting in common as input terminals with a sinusoidal source 28 coupled thereto. Terminals $22_3$ and $22_4$ operate as output terminals and are commonly coupled to a load 30 shown as a resistive impedance. An electric excitation field is generated across the gap $26_2$ and along the $x_1''$ axis and $\Psi = 0°$.

With respect to FIG. 7, the sinusoidal input source 28 is commonly coupled to segments $22_1$ and $22_4$ generating an excitation field across the gap $26_1$ which is directed along the $x_3''$ axis, thereby providing an angle $\Psi = 90°$.

A field of $\Psi = 45°$ is achieved simply by taking one-half the linear super position of FIGS. 6 and 7 as shown in FIG. 8 where the sinusoidal input source 28 is coupled directly to the electrode segment $22_1$ and to the two opposing electrode segments $22_2$ and $22_4$ by means of a pair of variable impedances or attenuators 30 and 32 with a load 30 connected to electrode segment $22_3$. In such a case, fields are generated across both gaps $26_1$ and $26_2$ which by varying the value of the attenuators can arbitrarily control the value of $\Psi$. Where the values of attenuation of the variable impedances 30 and 32 are set to be substantially equal, electric excitation fields which are oriented mutually at 90° will produce a resultant field where $\Psi = 45°$.

It should be noted that similar excitation schemes would be employed for the electrode configuration shown in FIG. 4 or a configuration having even a greater number of electrode segments than shown in FIG. 4.

Thus, what has been shown and described is a crystal resonator having multiply segmented lateral-field excitation electrodes which permit the lateral-field direction to be arbitrarily selected and controlled through appropriate connections to the external terminals which in turn permits tunability of the resonator antiresonances, antiresonance frequency-temperature behavior, and modal excitations.

Having thus shown and described what is at present considered to be the preferred embodiments of the invention, it should be noted that the same has been made by way of illustration and not limitation. Accordingly, all modifications, alterations, and changes coming within the spirit and scope of the invention as set forth in the appended claims are herein meant to be included.

We claim:

1. A tunable crystal resonator, comprising:
    a piezoelectric crystal plate having predetermined coordinate axes and at least one major face for supporting lateral-field excitation electrodes thereon;
    at least three lateral-field excitation electrode segments formed on said one major face and being mutually separated by at least two gaps located centrally between the at least three lateral-field electrodes; and means for applying varying excitation signals of predetermined magnitudes and phases to predetermined ones of said electrode segments wherein the varying excitation signals generate a varying lateral-field across at least one of said gaps and generate the lateral-field being oriented at variable angles with respect to said coordinate axes of the crystal plate for changing the lateral-field piezoelectric coupling thereof so as to alter the electrical characteristics of the resonator including strength of excitation modes, lateral-field excitation antiresonance frequencies, and frequency-temperature behavior.

2. A tunable crystal resonator according to claim 1, wherein said electrode segments are equally spaced on said one major face.

3. A tunable crystal resonator according to claim 2, wherein the number of said electrode segments is greater than three.

4. A tunable crystal resonator according to claim 3, wherein said electrode segments comprise segments arranged radially on said one major face.

5. A tunable crystal resonator according to claim 4, wherein said electrode segments include tapered inner extremities defining said gaps.

6. The crystal resonator according to claim 5, wherein said electrode segments comprise generally linear segments and said tapered inner extremities include generally linear tapers.

7. A tunable crystal resonator according to claim 1, wherein four electrode segments are formed on said one major face.

8. A tunable crystal resonator as defined by claim 7, wherein said four electrode segments are arranged in mutual quadrature relationships and forming thereby two gaps which are oriented substantially at right angles to one another.

9. A tunable crystal resonator according to claim 8, wherein said four electrode segments comprise generally linear segments extending to the periphery of the crystal plate and wherein said two gaps are formed at a center portion of said major surface.

10. A tunable crystal resonator according to claim 7, wherein said means for applying an excitation signal comprises means for coupling an excitation signal to a pair of adjacent electrode segments.

11. A tunable crystal resonator according to claim 7, wherein said means for applying an excitation signal includes means for applying an excitation signal to a pair of mutually aligned electrode segments.

12. A tunable crystal resonator according to claim 7, wherein said means for applying an excitation signal comprises means for directly coupling said excitation signal to one of said electrode segments and coupling said excitation signal through respective impedance elements coupled to a pair of electrode segments adjacent said one electrode segment.

13. A tunable crystal resonator according to claim 7, wherein said means for applying an excitation signal comprises means for applying an excitation signal to selected ones of said four electrode segments, thereby generating an angle $90° \leq \Psi \geq 0°$ with respect to said coordinated axis of the crystal plate for varying the lateral-field piezoelectric coupling k.

14. A tunable crystal resonator according to claim 1, wherein said resonator plate comprises a disc member having two major faces mutually opposing one another.

15. A tunable crystal resonator according to claim 14 wherein said two major faces comprise generally flat faces.

16. A tunable crystal resonator according to claim 14 wherein said two major faces comprise plano-convex faces.

17. A tunable crystal resonator according to claim 14 wherein said two major faces comprise bi-convex faces.

18. A tunable crystal resonator according to claim 14 wherein said two major faces comprise plano-concave faces.

19. A tunable crystal resonator according to claim 14 wherein said two major faces comprise bi-concave faces.

20. A tunable crystal resonator according to claim 14 wherein said two major faces comprise faces selected from the group consisting of planar, convex and concave faces.

* * * * *